United States Patent [19]

Ham

[11] Patent Number: 5,874,763

[45] Date of Patent: Feb. 23, 1999

[54] INTEGRATED CIRCUITS HAVING IMPROVED ELECTROSTATIC DISCHARGE CAPABILITY

[75] Inventor: Seog-Heon Ham, Seoul, Rep. of Korea

[73] Assignee: Samsung Electronics Co., Ltd., Suwon

[21] Appl. No.: 753,939

[22] Filed: Dec. 2, 1996

[30] Foreign Application Priority Data

Dec. 2, 1995 [KR] Rep. of Korea .................. 1995 46232

[51] Int. Cl.⁶ ........................... H01L 27/02; H01L 29/78
[52] U.S. Cl. ........................ 257/360; 257/355; 257/356
[58] Field of Search .................................. 257/355, 356, 257/360

[56] References Cited

U.S. PATENT DOCUMENTS

| | | | |
|---|---|---|---|
| 4,692,781 | 9/1987 | Roundtree et al. | 357/23.13 |
| 4,952,994 | 8/1990 | Lin | 357/23.13 |
| 5,166,089 | 11/1992 | Chen et al. | 437/51 |
| 5,229,635 | 7/1993 | Bessolo et al. | 257/360 |
| 5,270,565 | 12/1993 | Lee et al. | 257/355 |
| 5,290,724 | 3/1994 | Leach | 257/360 |
| 5,404,041 | 4/1995 | Diaz et al. | 257/360 |
| 5,436,484 | 7/1995 | Iwai et al. | 257/360 |
| 5,450,267 | 9/1995 | Diaz et al. | 361/56 |
| 5,468,667 | 11/1995 | Diaz et al. | 437/50 |

FOREIGN PATENT DOCUMENTS 0292327   11/1988   European Pat. Off. ............... 257/260

*Primary Examiner*—Peter Toby Brown
*Assistant Examiner*—Hung Van Duong
*Attorney, Agent, or Firm*—Myers Bigel Sibley & Sajovec

[57] ABSTRACT

Integrated circuits having improved electrostatic discharge capability include MOS transistors having wide channel widths formed by patterning a plurality of MOS transistor cells side-by-side in a well region as a highly integrated ladder network. The drain regions of the MOS transistor cells are coupled to an input pad to be protected and the source regions of the MOS transistor cells are coupled to a reference signal line (e.g., GND, VSS). The gate electrodes of the MOS transistor cells are also coupled together and indirectly through the well region to the reference signal line. The gates electrodes are coupled to the well region so that at the onset of reverse P-N junction breakdown between one or more of the drain regions (e.g., N-type) and the well region (e.g., P-type), the potentials of the gate electrodes of the MOS transistor cells are increased. This increase in gate electrode potential causes the breakdown voltages of the other nonconducting drain regions to be lowered to initiate breakdown so that the electrostatic discharge current can be more uniformly shared by all of the MOS transistor cells.

15 Claims, 5 Drawing Sheets

INTEGRATED CIRCUITS HAVING IMPROVED ELECTROSTATIC DISCHARGE CAPABILITY

FIELD OF THE INVENTION

The present invention relates to integrated circuit semiconductor devices, and more particularly to integrated circuit semiconductor devices having electrostatic discharge (ESD) circuits therein.

BACKGROUND OF THE INVENTION

Electrostatic discharge and electrical overstress account for more than fifty (50) percent of the field related failures in integrated circuits. In particular, electrostatic discharge (ESD) and electrical overstress (EOS) protection circuitry plays an important role in the design, layout and testing of integrated circuits (IC) because many of the functional circuit elements on state-of-the-art integrated circuits are susceptible to high voltages caused by, among other things, electrostatic build-up of charge. This is especially true for complementary metal oxide semiconductor (CMOS) based integrated circuits because in high density CMOS circuits, high voltages caused by electrostatic build-up can destroy gate oxides associated with individual transistors and logic gates, etc. To protect against these types of failures, many attempts have been made to develop ESD and EOS protection devices.

One such attempt is disclosed in U.S. Pat. No. 4,692,781 to Rountree et al. entitled Semiconductor Device with Electrostatic Discharge Protection, assigned to Texas Instruments, Inc. The '781 patent discloses an input protection circuit containing a thick-oxide transistor connected between a metal I/O pad and ground. The spacing between the metal-to-silicon drain contact and the channel of this transistor is made large so that the metal drain contact will not be melted by heat propagated along the silicon surface during a current spike caused by an ESD event. U.S. Pat. No. 4,952,994 to Lin entitled Input Protection Arrangement for VLSI Integrated Circuit Devices, assigned to Digital Equipment Corp., also discloses an input protection circuit for diverting electrostatic discharge current away from functional circuit elements which are connected to I/O pads on an integrated circuit chip. The input protection circuit comprises a MOS transistor having a gate electrode and a field oxide insulating layer capable of sustaining high voltages. Other attempts to develop ESD/EOS protection circuits are also disclosed in U.S. Pat. Nos. 5,404,041, 5,450,267 and 5,468,667 to C. H. Diaz, C. Duvvury and S. M. Kang. In particular, the '041 and '667 patents disclose MOS-type ESD/EOS protection devices with source and drain contact spacings that are designed to increase the failure threshold of the protection devices. In addition, the '267 patent discloses an ESD/EOS protection circuit including both MOS and bipolar transistors.

FIG. 1 also illustrates a conventional NMOS-based ESD device having a comb-shaped drain electrode 10 connected to an input/output pad, a comb-shaped source electrode 14 connected to a reference signal line (VSS) and a comb-shaped gate electrode directly coupled to the comb-shaped source electrode 14 by vias, as illustrated. Direct electrical contact is also made between the source electrode 14 and the P-well in which the NMOS transistor is formed by a pair of fingers which contact P+ contact regions in the P-well using a plurality of vias. Unfortunately, during the occurrence of an electrostatic discharge event (which may be caused by the application of a voltage spike to the input/output pad), current localization may take place near the drain regions of the central MOS cells (shown as region 18) if their respective drain and source regions turn-on early in response to impact ionization breakdown at the reverse-biased drain region junction. In particular, in the event lateral current is established in the P-well region (underneath the NMOS cells) the potential of the P-well region adjacent the centrally-located source and drain regions will increase and cause an early turn-on of the forward-biased P-well/N-source junction. As will be understood by those skilled in the art, this early turn-on can cause a nonuniform electrostatic discharge current to be established in the NMOS cells and poor electrostatic discharge protection capability.

Thus, notwithstanding the recognition of the problem of electrostatic discharge and electrical overstress faults and the many attempts to inhibit integrated circuit failure resulting therefrom using conventional ESD/EOS protection circuits, there continues to be a need for improved electrostatic discharge protection devices.

SUMMARY OF THE INVENTION

It is therefore an object of the present invention to provide integrated circuits having improved electrostatic discharge capability.

It is another object of the present invention to provide electrostatic discharge devices having uniform turn-on characteristics for discharging electrostatically-generated potentials applied thereto.

These and other objects, features and advantages of the present invention are provided by integrated circuits which use MOS transistors having wide channel widths to provide electrostatic discharge capability at input pads thereof. The wide channel widths are achieved by patterning a plurality of MOS transistor cells side-by-side in a well region as a highly integrated ladder network. The drain regions of the MOS transistor cells are coupled to an input/output pad to be protected and the source regions of the MOS transistor cells are coupled to a reference signal line (e.g., GND, VSS). The gate electrodes of the MOS transistor cells are also coupled together and indirectly through the well region to the reference signal line. In particular, the gates electrodes are coupled to the well region so that at the onset of reverse P-N junction breakdown between one or more of the drain regions (e.g., N-type) and the well region (e.g., P-type), the potentials of the gate electrodes of the MOS transistor cells are increased. This increase in gate electrode potential causes the breakdown voltages of the other nonconducting drain regions to be lowered to initiate breakdown so that the electrostatic discharge current can be more uniformly shared by all of the MOS transistor cells.

According to a preferred embodiment of the present invention, an integrated circuit is provided comprising a semiconductor substrate (e.g., N-type) with a P-type well region therein extending to a face thereof, an input/output pad and reference signal line thereon and at least first and second well contact regions of first conductivity type (e.g., P+) in the P-type well region. A plurality of MOS transistor cells having N-type source and drain regions are also provided in the well region, intermediate the first and second well contact regions. To provide improved electrostatic discharge capability, the source regions of the MOS transistor cells are electrically coupled to the reference signal line and the second well contact region by a first electrically conductive layer (e.g., metallization) on the substrate. In addition, the gate electrodes of the MOS transistor cells are electrically coupled to the first well contact region. But, in contrast to the prior art, the gate electrodes are not directly connected through vias to the reference signal line on the substrate surface. Instead, the lateral resistance ($R_{well}$) of the well region extending underneath the MOS cells is provided as an indirect electrical connection between the gate electrodes and the reference signal line. Thus, because of the lateral resistance, the potentials of the gate electrodes vary directly based on the magnitude of the lateral current induced in the well region. This lateral current is induced when breakdown of one-or-more of the drain-well junctions occurs in response to an electrostatic discharge event caused by the application of a high potential (e.g., voltage spike) to the input pad.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout. Moreover, the terms "first conductivity type" and "second conductivity type" refer to opposite conductivity type such as P or N-type, however, each embodiment described and illustrated herein includes its complementary embodiment as well.

Figure 2:
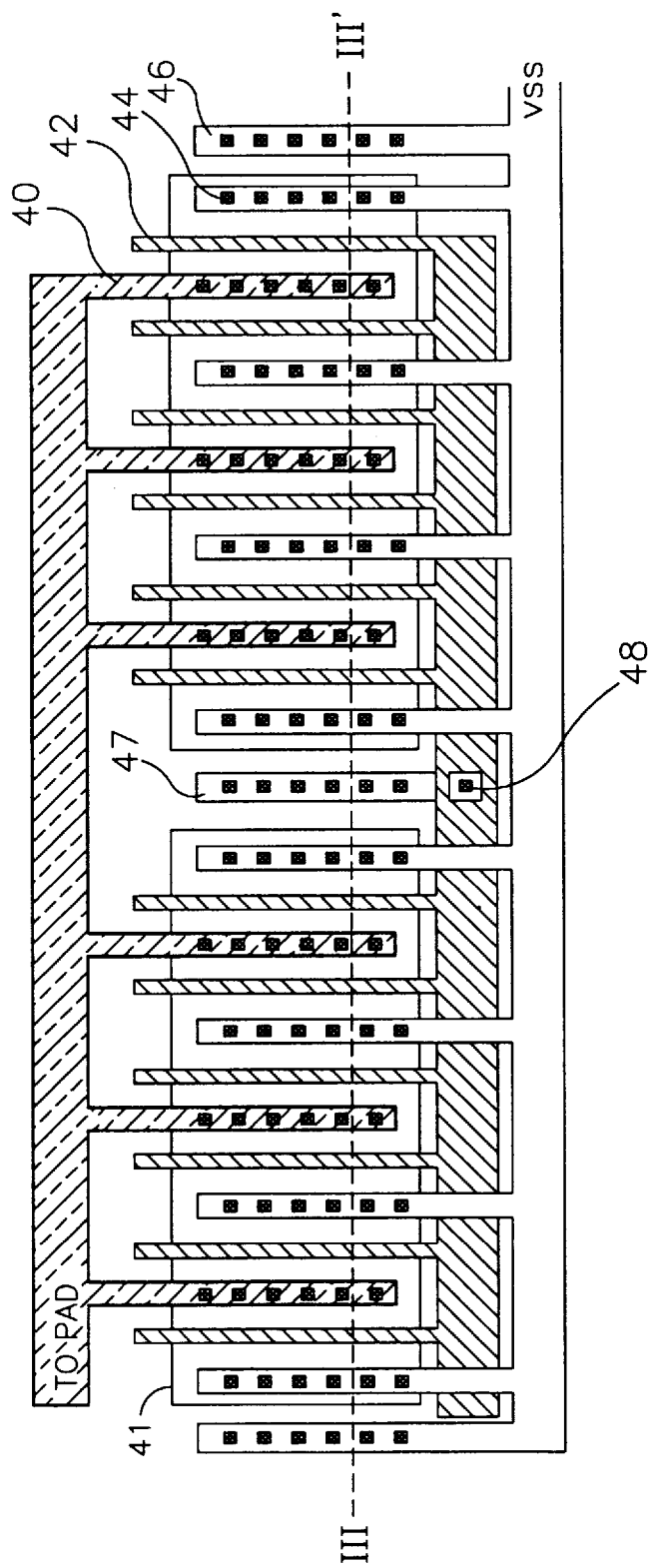
FIG. 2 is a plan view of an electrostatic discharge (ESD) protection device according to an embodiment of the present invention.
Figure 3:
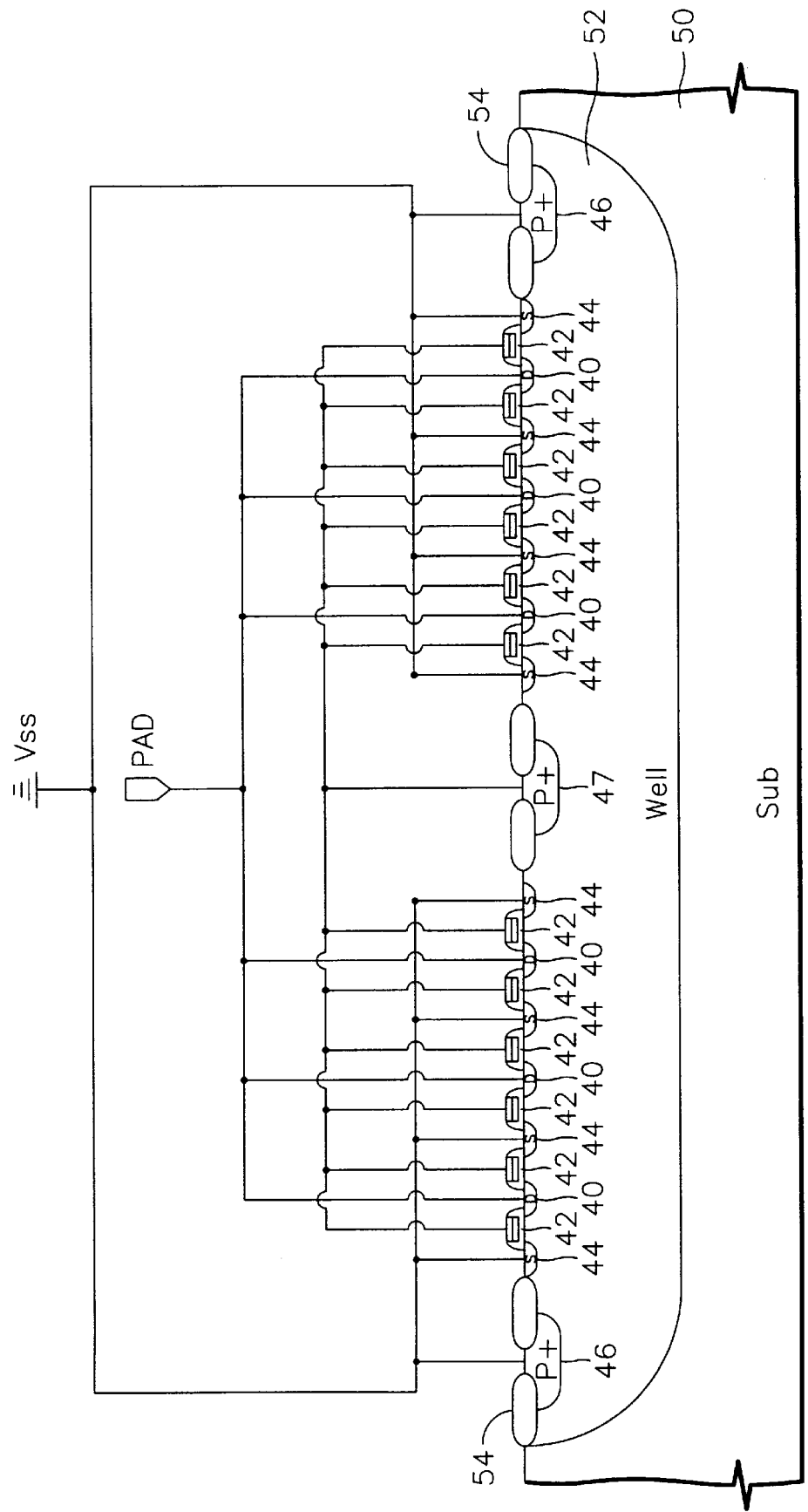
FIG. 3 is a cross-sectional view of the ESD protection device of FIG. 2, taken along line III–III'.

Referring now to FIGS. 2–6, electrostatic discharge devices according to the present invention preferably comprise a plurality of MOS transistor cells patterned side-by-side in a well region as a highly integrated ladder network. As illustrated by FIGS. 2–3, a semiconductor substrate 50 is provided containing a well region 52 of first conductivity type (e.g., P-type) therein extending to a face thereof. In the well region 52, a plurality of relatively highly doped well contact regions 46 and 47 of first conductivity type (e.g., P+) are provided. In particular, first and second well contact regions 46 are provided adjacent respective first and second ends of the well region 52 when viewed in transverse cross-section as illustrated best by FIG. 3 which is a schematic cross-sectional view of the device of FIG. 2, taken along line III–III'. The third well contact region 47 is also provided intermediate the first and second ends of the well region 52. As illustrated best by FIG. 2, the first and second well contact regions 46 are preferably patterned as stripes and are connected to a conductive reference signal line (VSS) through a plurality of metal-filled vias (shown as six (6)). The third well contact region 47 is also preferably patterned as a stripe and is connected directly to a segment of metallization by equally spaced vias and through the segment of metallization to a comb-shaped polysilicon gate electrode 42 by a via 48.

First and second pluralities of side-by-side MOS transistors are also provided between the first and third well contact regions and second and third well contact regions, respectively. As illustrated, the MOS transistors have N-type source and drain regions 44 and 40, respectively which are defined by a mask 41 during processing. Here, the resulting source and drain regions 44 and 40 are also stripe-shaped. The stripe-shaped source regions 44 are connected through vias to the comb-shaped reference signal line (VSS) and the stripe-shaped drain regions 40 are connected through vias to a comb-shaped input/output signal line (Vout) which is coupled to an input/output pad (PAD) to be protected. To achieve high integration densities, the fingers of the comb-shaped reference signal line (VSS) and input/output signal line (Vout) are patterned as interdigitated fingers, as illustrated. Field oxide isolation 54 is also provided.

Figure 4:
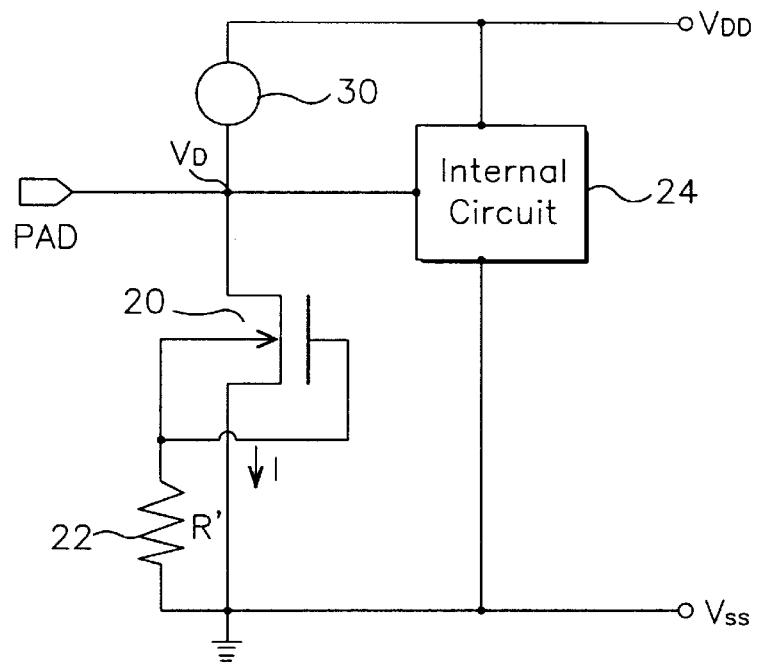
FIG. 4 is an electrical schematic of an integrated circuit containing an ESD protection device according to the present invention.

Referring now to FIG. 4, an electrical schematic of an integrated circuit according to an embodiment of the present invention is illustrated. In particular, the plurality of MOS transistor cells of FIG. 3 are illustrated as a single electrostatic discharge (ESD) MOSFET 20 having a drain region connected to an input/output pad and an internal circuit 24 to be protected, a source region connected to the reference signal line VSS and a gate electrode indirectly connected to the reference signal line VSS by a P-well resistor 22 having a value determined by the lateral resistance of the P-well region 52 illustrated by FIG. 3. The integrated circuit may also comprise a second ESD MOSFET 30 connected between input/output node $V_D$ and a power supply potential VDD.

As determined by the inventors herein, improved electrostatic discharge capability can be achieved by indirectly coupling the gate electrodes of the MOS transistor cells to the reference signal line VSS, by connecting the gate electrodes to the center well contact region 47. Here, the establishment of a lateral discharge current in the P-well region 52 upon the occurrence of an electrostatic discharge event (e.g., voltage spike) causes the potential of the center well contact region 47 and gate electrodes to increase relative to the potential of the reference signal line VSS (e.g., GND).

Figure 5:
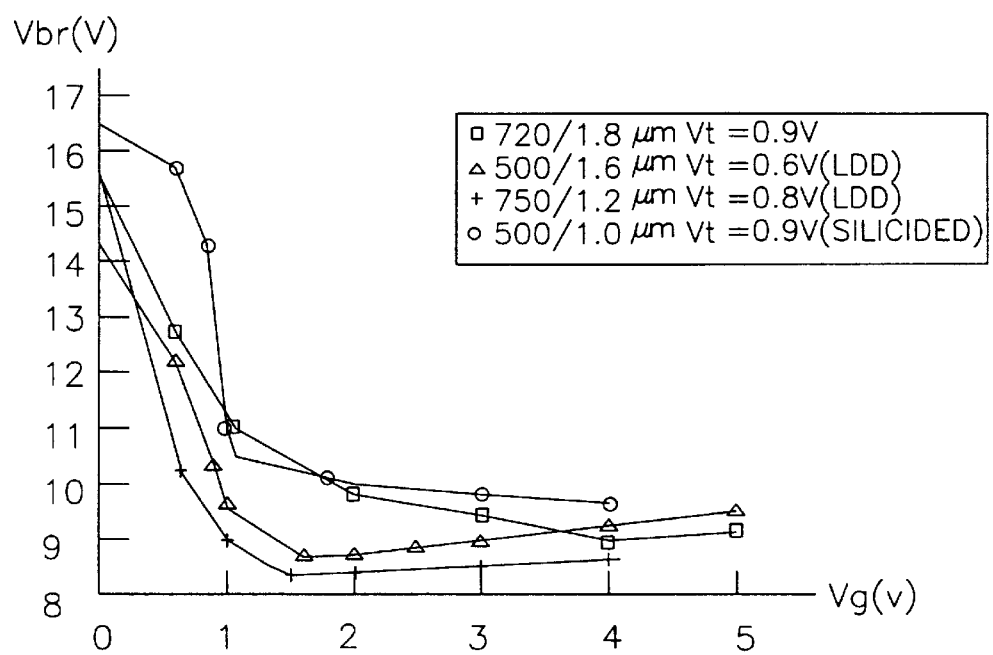
FIG. 5 is a graph illustrating a relationship between the breakdown voltage of a reverse biased P-N junction of a MOS transistor cell and the magnitude of the gate bias applied thereto.
Figure 6:
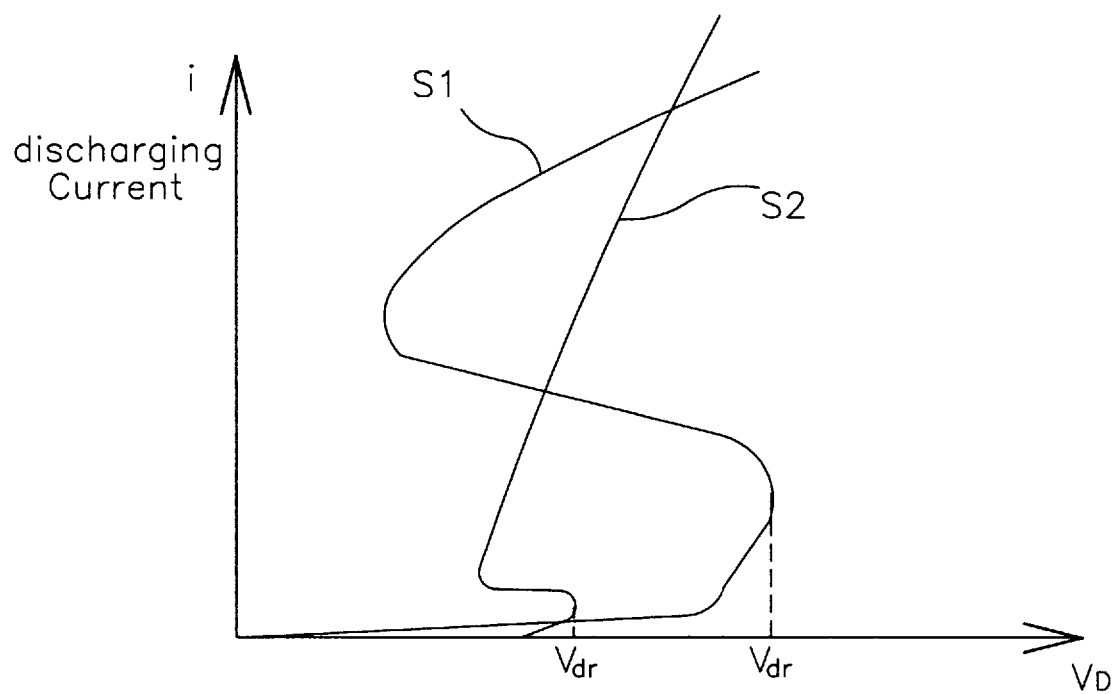
FIG. 6 is a graph illustrating a relationship between discharge current and drain potential for the MOS transistor of FIG. 4, at two breakdown voltage levels.

As best illustrated by FIG. 5, which is a graph of the reverse breakdown voltage of the P-N junction diode (formed between a drain region 40 and the P-well 52) versus the potential of a respective gate electrode 42 of a MOS transistor cell, an increase in the potential of the center well contact region 47 will lower the breakdown voltage of the MOS cells. Thus, in the event one or more of the drain regions 40 of the MOS cells begins to discharge charge carriers into the P-well region before the other cells have begun to discharge, the potential of the center contact region 47 will increase and the breakdown voltages of the cells will decrease so that they can contribute charge carriers to the P-well region and the electrostatic discharge current can be more equally shared by the cells. For example, as illustrated by FIG. 6, curves S1 and S2 illustrate a graph of MOS cell discharge current (i) versus input/output pad potential ($V_D$) for a MOS cell having a first gate bias (e.g., 0V) and a second gate bias greater than the first gate bias, respectively. The four curves in FIG. 5 represent experimental results of breakdown voltage versus gate bias for MOS transistors having widths in a range between 500–750 $\mu$m and threshold voltages in a range between 0.6–0.9V.

Figure 1:
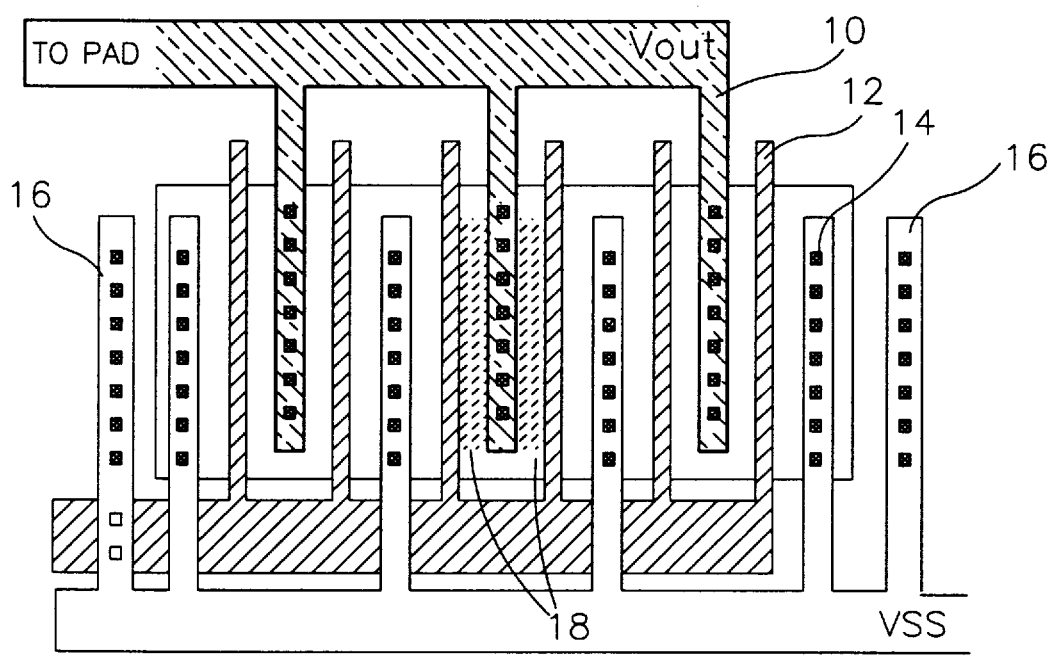
FIG. 1 is a plan view of an NMOS electrostatic discharge (ESD) protection device according to the prior art.

Thus, in contrast to the prior art device of FIG. 1 where the gate electrodes and reference signal line are directly connected by vias on a surface of a substrate, the gates electrodes of the present invention are coupled to a well region so that at the onset of reverse P-N junction breakdown between one or more of the drain regions (e.g., N-type) and the well region (e.g., P-type), the potentials of the gate electrodes of the MOS transistor cells are increased. This increase in gate electrode potential causes the breakdown voltages of the other nonconducting drain regions to be lowered to initiate breakdown so that the electrostatic discharge current can be more uniformly shared.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit having electrostatic discharge capability, comprising:

a semiconductor substrate containing a well region of first conductivity type therein extending to a face thereof;

a pad on said semiconductor substrate;

a reference signal line on said semiconductor substrate;

first and second well contact regions of first conductivity type in the well region adjacent respective first and second ends thereof;

a third well contact region of first conductivity type in the well region of first conductivity type, intermediate the first and second ends of the well region;

a first plurality of MOS transistor cells having source and drain regions of second conductivity type in the well region, intermediate said first and third well contact regions; and a second plurality of MOS transistor cells having source and drain regions of second conductivity type in the well region, intermediate said second and third well contact regions;

wherein the source regions of said first and second plurality of MOS transistor cells are electrically coupled to said reference signal line and said first and second well contact regions by a first electrically conductive layer on said substrate;

wherein the drain regions of said first and second plurality of MOS transistor cells are electrically coupled to said pad by a second electrically conductive layer on said substrate; and wherein gate electrodes of said first and second plurality of MOS transistor cells are electrically coupled to said third well contact region by a third electrically conductive layer on said substrate.

2. The integrated circuit of claim 1, wherein the first, second and third electrically conductive layers are nonintersecting.

3. The integrated circuit of claim 2, wherein said first, second and third well contact regions have a first conductivity type doping concentration therein greater than a first conductivity type doping concentration of the well region of first conductivity type.

4. The integrated circuit of claim 3, wherein said first, second and third well contact regions form respective nonrectifying junctions with the well region of first conductivity type.

5. The integrated circuit of claim 4, wherein the well region of first conductivity type comprises a well region of P-type conductivity.

6. The integrated circuit of claim 5, wherein the source and drain regions of said first and second plurality of MOS transistor cells form P-N rectifying junctions with the well region of first conductivity type.

7. The integrated circuit of claim 6, wherein the third conductive layer is patterned to have a plurality of spaced fingers commonly joined at first ends thereof.

8. The integrated circuit of claim 6, wherein first and second conductive layers are each patterned to have a plurality of spaced fingers commonly joined at respective first ends thereof.

9. The integrated circuit of claim 8, wherein the fingers of the first and second conductive layers are patterned as opposing interdigitated fingers.

10. The integrated circuit of claim 9, wherein said first plurality of MOS transistor cells are spaced from the first and third well contact regions by a field oxide isolation region.

11. An integrated circuit having electrostatic discharge capability, comprising:

a semiconductor substrate containing a well region of first conductivity type therein extending to a face thereof;

an input pad on said semiconductor substrate;

a reference signal line on said semiconductor substrate;

first and second stripe-shaped well contact regions of first conductivity type in the well region; and a plurality of MOS transistor cells having source and drain regions of second conductivity type in the well region, intermediate said first and second well contact regions;

wherein the source regions of said plurality of MOS transistor cells are electrically coupled to said reference signal line and said second stripe-shaped well contact region by a first electrically conductive layer on said substrate;

wherein the drain regions of said plurality of MOS transistor cells are electrically coupled to said input pad by a second electrically conductive layer on said substrate;

wherein gate electrodes of said plurality of MOS transistor cells are electrically coupled to said first stripe-shaped well contact region by a third electrically conductive layer on said substrate; and wherein the first and third electrically conductive layers are electrically disconnected from each other except indirectly via the well region of first conductivity type.

12. The integrated circuit of claim 11, wherein said first and second well contact regions have a first conductivity type doping concentration therein greater than a first conductivity type doping concentration of the well region of first conductivity type.

13. The integrated circuit of claim 12, wherein the third conductive layer is patterned to have a plurality of spaced fingers commonly joined at first ends thereof to said first well contact region.

14. The integrated circuit of claim 13, wherein first and second conductive layers are each patterned to have a plurality of spaced stripe-shaped fingers commonly joined at respective first ends thereof.

15. The integrated circuit of claim 14, wherein the fingers of the first and second conductive layers are patterned as opposing interdigitated fingers.

* * * * *